United States Patent
Ho et al.

(10) Patent No.: US 8,751,987 B2
(45) Date of Patent: Jun. 10, 2014

(54) METHOD OF RESISTOR MATCHING IN ANALOG INTEGRATED CIRCUIT LAYOUT

(75) Inventors: Tsung-Yi Ho, Tainan (TW); Sheng-Jhih Jiang, Tainan (TW); Chan-Liang Wu, Tainan (TW)

(73) Assignee: Oryx Holdings Pty Ltd., Queensland (AU)

( * ) Notice: Subject to any disclaimer, the term of this patent is extended or adjusted under 35 U.S.C. 154(b) by 103 days.

(21) Appl. No.: 13/547,520

(22) Filed: Jul. 12, 2012

(65) Prior Publication Data
US 2013/0145332 A1    Jun. 6, 2013

Related U.S. Application Data

(60) Provisional application No. 61/565,752, filed on Dec. 1, 2011.

(51) Int. Cl.
*G06F 17/50* (2006.01)
(52) U.S. Cl.
USPC ............. 716/110; 716/106; 716/10; 716/111; 716/119

(58) Field of Classification Search
USPC .................. 716/100, 105–107, 110–111, 119
See application file for complete search history.

(56) References Cited

U.S. PATENT DOCUMENTS

2011/0066997 A1*   3/2011   O'Riordan et al. ........... 716/136

* cited by examiner

*Primary Examiner* — Paul Dinh
(74) *Attorney, Agent, or Firm* — Stout, Uxa, Buyan & Mullins, LLP; Donald E. Stout

(57) ABSTRACT

A method of resistor matching in analog integrated circuit layout is disclosed. Shapes of mismatching resistor blocks are analyzed to obtain geometrical information for deforming the mismatching resistor blocks. The mismatching resistor blocks are deformed into centrosymmetrical blocks according to the obtained geometrical information, each mismatching resistor block being decomposed to a plurality of unit-resistors. The unit-resistors are placed into matching resistor blocks to return a resulting layout with improved matching quality by reducing centroid offset between a centroid of the unit-resistors and a centroid of the matching resistor block.

6 Claims, 6 Drawing Sheets

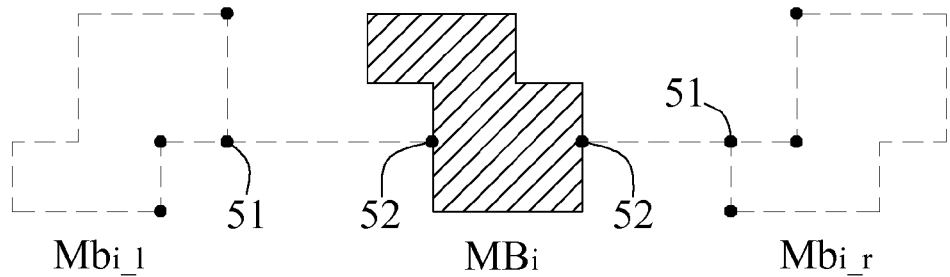
FIG.5A
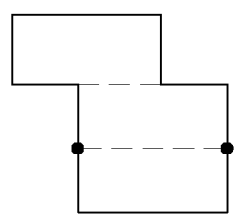 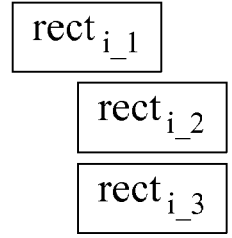 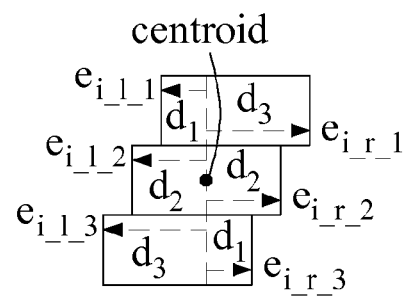
FIG.5B FIG.5C FIG.5D

METHOD OF RESISTOR MATCHING IN ANALOG INTEGRATED CIRCUIT LAYOUT

CROSS-REFERENCE TO RELATED APPLICATIONS

This application claims the benefit of U.S. Provisional Application No. 61/565,752, filed on Dec. 1, 2011 and entitled "Nonlinear Optimization Methodology for Resistor Matching in Analog Integrated Circuits", the entire contents of which are hereby incorporated by reference.

BACKGROUND OF THE INVENTION

1. Field of the Invention

The present invention generally relates to analog integrated circuit layout, and more particularly to a nonlinear optimization method for resistor matching in analog integrated circuits.

2. Description of Related Art

Integrated circuit (IC) layout is a representation of an integrated circuit in terms of planar geometric shapes corresponding to layer patterns of the integrated circuit. The key performance of modern analog integrated circuits, such as digital-to-analog converters (DACs), is related to the accuracy of resistance ratios. Severe distortion will present between the input and output signals if the resistors in the analog ICs are mismatched. Due to the cost issue, designers usually design an IC under the strict fixed-outline constrains. To fit the whole design into the fixed-sized chip, devices with low shape flexibility, such as macros and IPs, are placed first. After that, resistors with high shape flexibility are placed in the remaining space. However, the remaining space for resistors is usually in rectilinear shape rather than rectangular shape, and the resistors placement thus becomes a challenge of layout engineers. FIG. 1A shows a layout with a resistor block A according to a conventional method. FIG. 1B shows an enlarged view of the resistor block that is composed of three local matching resistor blocks with their associated centroids, and therefore the resistor block A as a whole commonly does not have high matching quality.

Although several works have studied the detail about the matching methodologies, however, none of the existing works has proposed a methodology to consider matching quality and fixed-outline constraint simultaneously.

Accordingly, a need has thus arisen to propose a novel method of resistor matching in analog integrated circuit layout to effectively improve matching quality and conform to fixed-outline constraint.

SUMMARY OF THE INVENTION

In view of the foregoing, the embodiment of the present invention provides a method of resistor matching in analog integrated circuit layout to improve matching quality of the decomposed matching structures in rectilinear blocks, while maintaining the block topology during the whole improving process in order not to change the original circuit property.

According to one embodiment, shapes of mismatching resistor blocks are analyzed to obtain geometrical information for deforming the mismatching resistor blocks. The mismatching resistor blocks are deformed into centrosymmetrical blocks according to the obtained geometrical information, each said mismatching resistor block being decomposed to a plurality of unit-resistors. The unit-resistors are placed into matching resistor blocks to return a resulting layout with improved matching quality by reducing centroid offset between a centroid of the unit-resistors and a centroid of the matching resistor block.

BRIEF DESCRIPTION OF THE DRAWINGS

FIG. 5A through FIG. 5D specifically show the matching analysis stage of FIG. 2;

DETAILED DESCRIPTION OF THE INVENTION

An embodiment of the present invention discloses a nonlinear optimization method for resistor matching in analog integrated circuits. According to one aspect of the embodiment, i.e., a coincidence rule, centers of constituent resistors (or unit-resistors) may be coincided at a centroid of a matching resistor block (that is deformed from a mismatching resistor block). According to another aspect of the embodiment, i.e., a dispersion rule, the unit-resistors of the common-centroid matching resistor block may be placed uniformly. Accordingly, matching quality of a matching resistor block in a layout may be evaluated in terms of both the degree of coincidence and the degree of dispersion. In this specification, let $NB=\{NB_1, NB_2, \ldots, NB_n\}$ denote a set of n normal blocks which are soft (or deformable) blocks and each element $NB_i$ in NB has its specific aspect ratio range $AS_i = [AS_{i\_min}, AS_{i\_max}]$. If the $AS_{i\_min}$ is equal to $AS_{i\_max}$, this means that the block $NB_i$ is a hard (or undeformable) block. Let $MB=\{MB_1, MB_2, \ldots, MB_m\}$ denote a set of m mismatching resistor blocks which are rectilinear blocks (each having more than four sides) to be matched. The disclosed embodiment can improve the matching quality of each mismatching resistor block in MB under fixed-outline constraint. The embodiment can also maintain the block topology in an initial layout L during the process such that the designed circuit features will not be changed. Therefore, no extra cost for redesigning the circuit features will be needed.

Figure 1A:
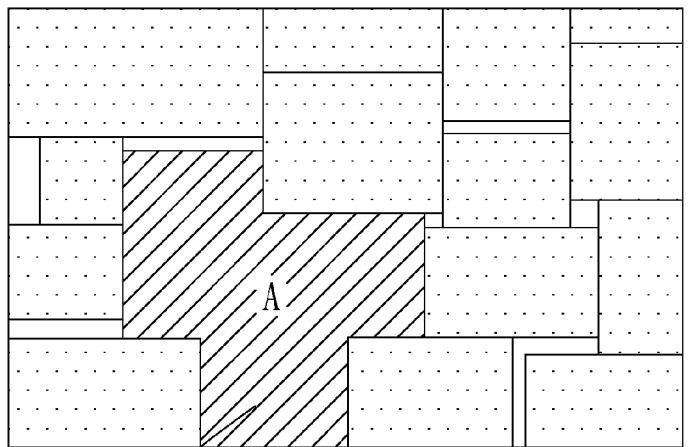
FIG. 1A shows a layout with a resistor block according to a conventional method.
Figure 1B:
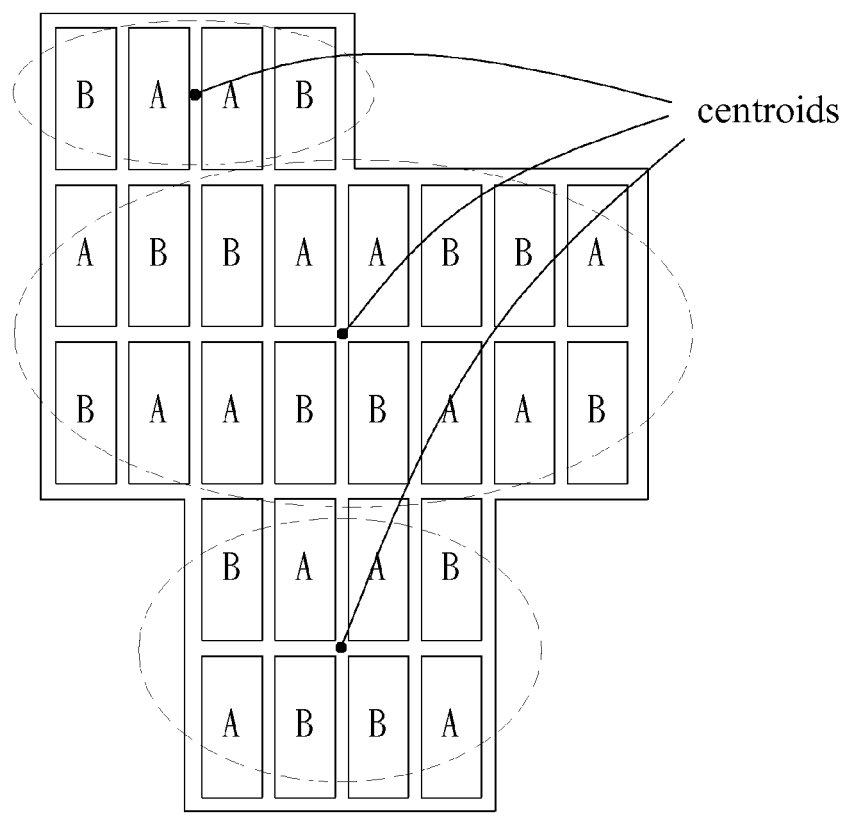
FIG. 1B shows an enlarged view of the resistor block of FIG. 1A.
Figure 2:
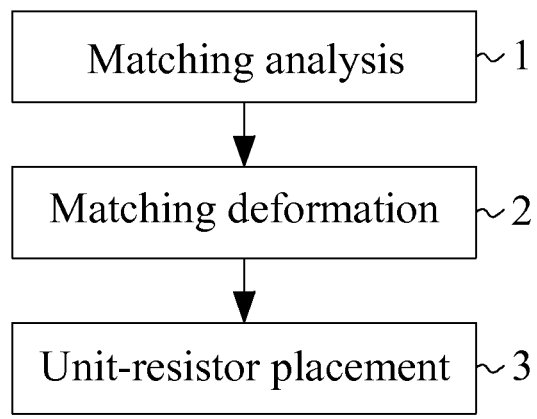
FIG. 2 shows a flow diagram generally illustrating a method of resistor matching in analog integrated circuit layout according to one embodiment of the present invention.

FIG. 2 shows a flow diagram generally illustrating a method of resistor matching in analog integrated circuit layout according to one embodiment of the present invention. In stage 1, shapes of the mismatching resistor blocks are analyzed to obtain geometrical information for deforming the mismatching resistor blocks. Subsequently, in stage 2, according to the obtained geometrical information, a nonlinear optimization technique is applied to deform the mismatching resistor blocks into centrosymmetrical blocks which are appropriate for obtaining better matching. Finally, in stage 3, the unit-resistors are assigned into modified mismatching resistor blocks, that is, matching resistor blocks, to return a resulting layout with improved matching quality.

Figure 3:
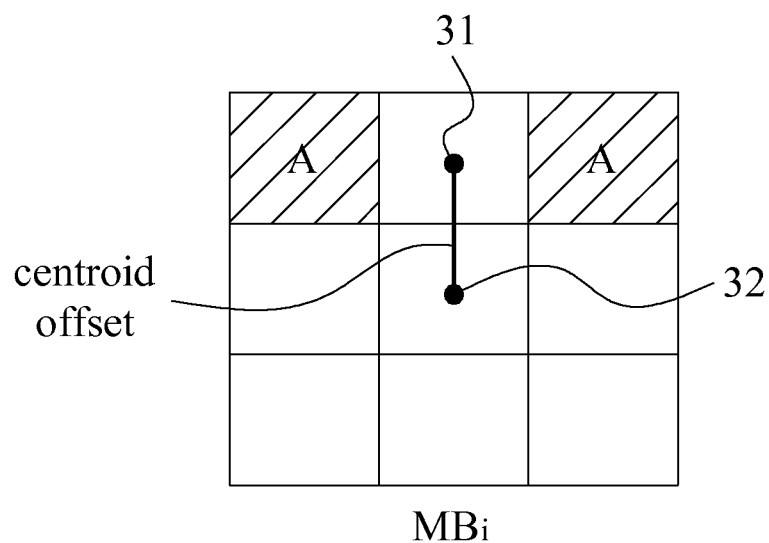
FIG. 3 shows an exemplary mismatching resistor block with two decomposed unit-resistors.
Figure 4A:
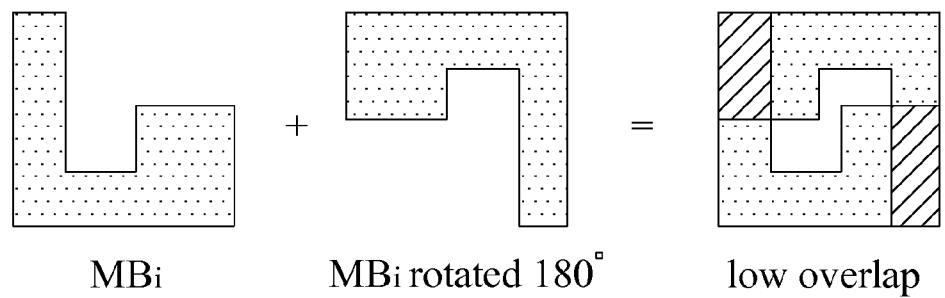
FIG. 4A and FIG. 4B exemplify evaluating the degree of centrosymmetry of a block.
Figure 4B:
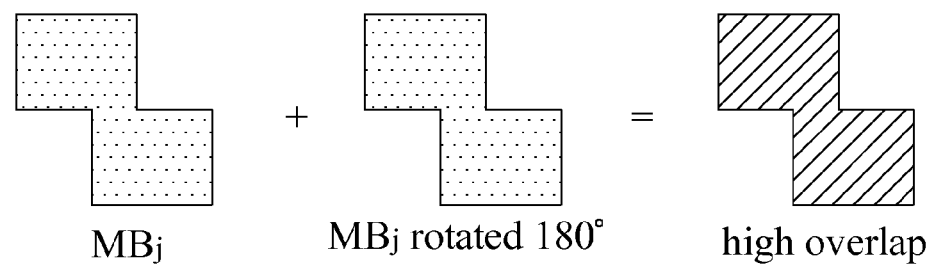

The embodiment improves matching quality by reducing centroid offset between a centroid of the constituent resistors (or unit-resistors) and a centroid of the matching resistor block. FIG. 3 shows an exemplary mismatching resistor block $MB_i$ with two decomposed unit-resistors A. The matching quality (or centrosymmetry) is low because there exists substantial centroid offset between the centroid 31 of the unit-resistors A and the centroid 32 of the mismatching resistor block $MB_i$. As exemplified in FIG. 4A and FIG. 4B, the degree of centrosymmetry of a (mismatching resistor) block may be evaluated by rotating the block 180 degrees and then comparing the rotated block to the original block. More overlapping between a block and its rotated one implies more centrosymmetry. The block exemplified in FIG. 4A has low degree of centrosymmetry because of low overlap between the block and its rotated one. The block exemplified in FIG. 4B, however, has high degree of centrosymmetry because of high overlap between the block and its rotated one.

FIG. 5A through FIG. 5D specifically show the matching analysis stage 1 of FIG. 2. Although the analysis process of vertical edges of a mismatching resistor block is illustrated in the figures, the analysis process of horizontal edges of the mismatching resistor block, however, is similar and is thus omitted for brevity. As shown in FIG. 5A, two mirrored blocks $MB_{i\_l}$ and $MB_{i\_r}$ of $MB_i$ are placed to the left and right sides of the mismatching resistor $MB_i$. All the end points 51, excluding the top and bottom end points, of the right-side vertical edges of the left mirrored block $MB_{i\_l}$ and the left-side vertical edges of the right mirrored block $MB_{i\_r}$ are projected to the mismatching resistor block $MB_i$. The projected points on $MB_i$ are called cut points 52.

After obtaining the cut points 52, the mismatching resistor block $MB_i$ is decomposed by horizontally cut through end points 51 of its vertical edges and the cut points 52 (FIG. 5B), resulting in decomposed rectangles $Rect_{MB\_i}=\{rect_{i\_1}, rect_{i\_2}, rect_{i\_3}\}$ (FIG. 5C), which will be used later for deformation. Moreover, all left-side vertical edges of the rectangles are collected as $E_{i\_L}=\{e_{i\_l\_1}, e_{i\_l\_2}, \ldots, e_{i\_l\_n}\}$, and all right-side vertical edges of the rectangles are collected as $E_{i\_R}=\{e_{i\_r\_1}, e_{i\_r\_2}, \ldots, e_{i\_r\_n}\}$. Subsequently, one edge from $E_{i\_L}$ from top to bottom and one edge from $E_{i\_R}$ from bottom to top are taken as a centrosymmetry pair. Repeat above process until the edges in $E_{i\_L}$ and $E_{i\_R}$ are totally paired. All the centrosymmetry pairs of $MB_i$ form a set $CS\text{-}pairs_{MB\_i}$. As exemplified in FIG. 5D, three centrosymmetry pairs $\{e_{i\_l\_1}, e_{i\_r\_3}\}$, $\{e_{i\_l\_2}, e_{i\_r\_2}\}$ and $\{e_{i\_l\_3}, e_{i\_r\_1}\}$ are formed. As the distances ($d_1$, $d_2$, $d_3$) to the centroid of the block of the two edges in each centrosymmetry pair are the same, the block is a centrosymmetrical block.

Subsequently, in the matching deformation stage 2 (FIG. 2), the shapes of the mismatching resistor blocks will be modified, under the fixed-outline constrains, to centrosymmetrical blocks for improving the matching quality, and, simultaneously, the original block topology in the layout should be preserved in order not to destroy the circuit features which were designed in early stages (not shown).

Figure 6:
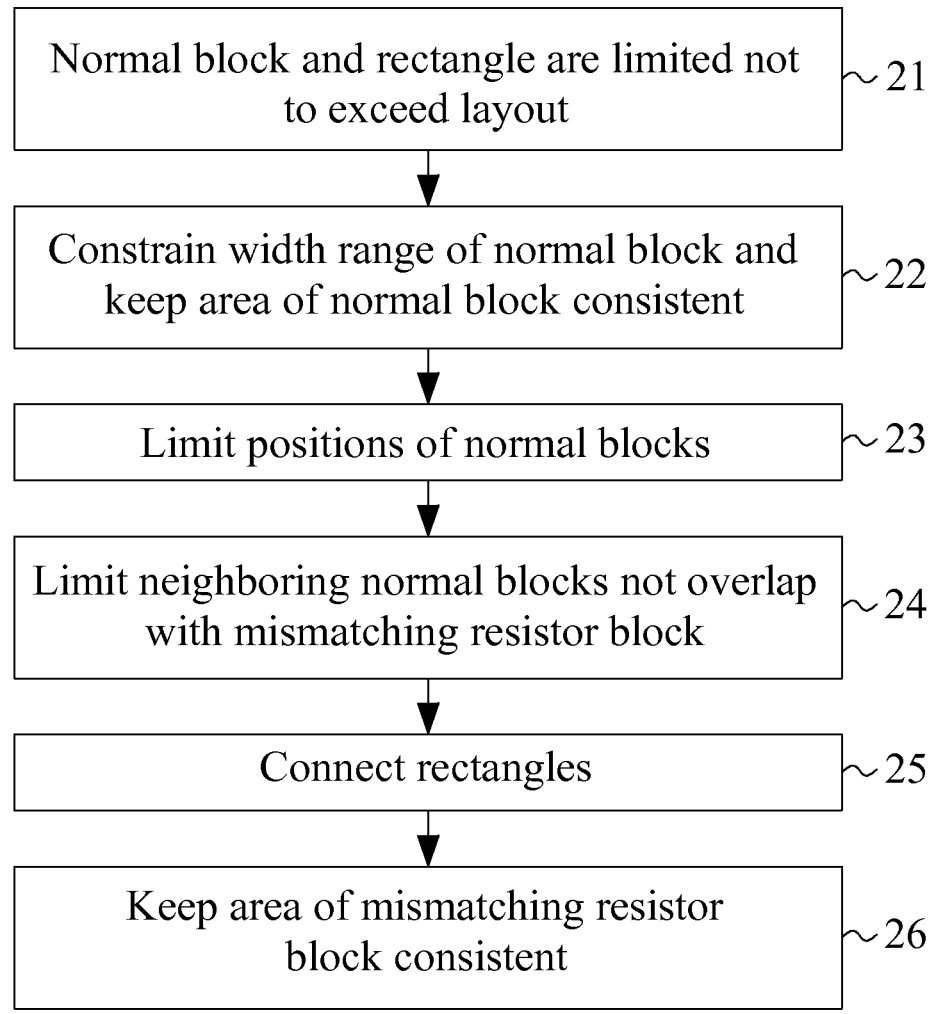
FIG. 6 shows a flow diagram illustrating the matching deformation stage of FIG. 2 according to one embodiment of the present invention.

FIG. 6 shows a flow diagram illustrating the matching deformation stage 2 according to one embodiment of the present invention. In step 21, all blocks in the normal block set NB and all rectangles of each mismatching resistor block in MB are limited not to exceed the coverage (i.e., width W and height H) of the layout:

$$x_i+w_i \leq W, \forall NB_i \in NB$$

$$y_i+h_i \leq H, \forall NB_i \in NB$$

$$x_{i\_a}+w_{i\_a} \leq W, \forall rect_{i\_a} \in Rect_{MB\_i}, \forall MB_i \in MB$$

$$y_{i\_a}+h_{i\_a} \leq H, \forall rect_{i\_a} \in Rect_{MB\_i}, \forall MB_i \in MB$$

where $(x_i,y_i)$ is the lower left corner of a $block_i$, $w_i$ and $h_i$ are width and height of the block, $(x_{i\_a},y_{i\_a})$ is the lower left corner of a rectangle $rect_{i\_a}$ of $MB_i$, $w_{i\_a}$ and $h_{i\_a}$ are width and height of the rectangle.

In step 22, the range of width of each $NB_i$ is constrained and the area $a_i$ of $NB_i$ in NB is kept consistent after deformation:

$$a_i/AS_{i\_max} \leq w_i \leq a_i/AS_{i\_min}, \forall NB_i \in NB$$

$$w_i \cdot h_i = a_i, \forall NB_i \in NB$$

In step 23, the positions of the blocks in NB are limited such that their relative positions are not changed after deformation:

$$x_i+w_i \leq x_j, \forall NB_i \in NB$$

$$y_i+h_i \leq y_j, \forall NB_i \in NB$$

In step 24, each neighboring normal block of the mismatching resistor block is limited not overlap with $MB_j$. Take left side as example:

$$x_i+w_i \leq x_{j\_a}+B_{i,j\_a,1} \cdot W, \forall NB_i \in NB_{left}, \forall rect_{j\_a} \in Rect_{MB\_j}, B_{i,j\_a,1} \text{ is binary}$$

$$|(y_i+h_i/2)-(y_a+h_a/2)| \geq (h_i/2+h_a/2)-B_{i,j\_a,2} \cdot H, \forall NB_i \in N\text{-}B_{left}, \forall rect_{j\_a} \in Rect_{MB\_j}, B_{i,j\_a,2} \text{ is binary}$$

$$0 \leq B_{i,j\_a,1}+B_{i,j\_a,2} \leq 1$$

In step 25, rectangles of a mismatching resistor block should be connected:

$$x_{i\_a}+w_{i\_a} \geq x_{i\_b}, rect_{i\_a}, rect_{i\_b} \in Rect_{MB\_i}$$

$$x_{i\_b}+w_{i\_b} \geq x_{i\_a}, rect_{i\_a}, rect_{i\_b} \in Rect_{MB\_i}$$

$$y_{i\_a}+h_{i\_a}=y_{i\_b}, rect_{i\_a}, rect_{i\_b} \in Rect_{MB\_i}$$

Finally, in step 26, the area $a_{MB\_i}$ of each $MB_i$ in MB is kept consistent after deformation:

$$\Sigma_{rect_{i\_a} \in Rect_{MB\_i}} w_{i\_a} \cdot h_{i\_a} = a_{MB\_i}, \forall MB_i \in MB$$

Regarding the unit-resistor placement stage 3 of FIG. 2, one unit-resistor is first removed from the mismatching resistor block, if there are odd number of unit-resistors. Subsequently, the removed unit-resistor is then placed at the center of the modified block. Accordingly, the remaining unit-resistors of the same resistor block will be perfectly paired, and each pair of the unit-resistors is then placed centrosymmetrically to the centroid of matching resistor block. The degree of coincidence of the resistor block will be improved after this assignment.

Moreover, two unit-resistors from different resistors may be randomly selected, and their positions being exchanged, and their corresponding centrosymmetrical unit-resistors are also exchanged. The exchange may be repeated until the degree of dispersion can no longer be enhanced.

Figure 7A:
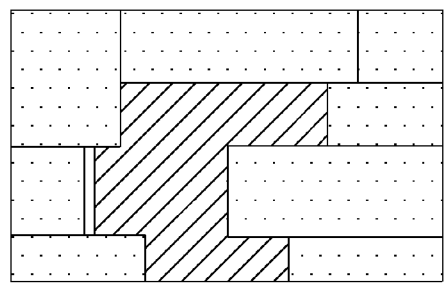
FIG. 7A through FIG. 7D show examples that demonstrate deforming mismatching resistor blocks to matching resistor blocks after applying the embodiment.
Figure 7B:
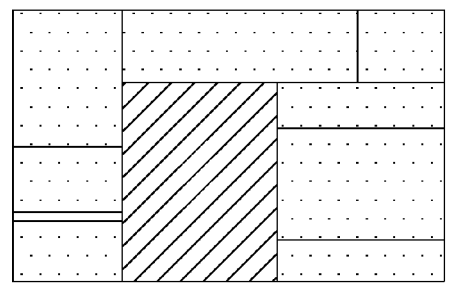
Figure 7C:
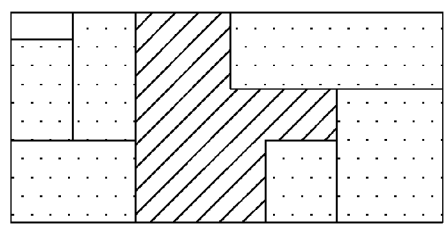
Figure 7D:
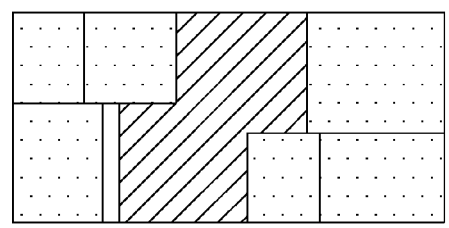

According to the embodiment as discussed above, the matching quality may be substantially improved by deforming the mismatching resistor block into a centrosymmetrical block which is more appropriate for matching than arbitrary rectilinear block. FIG. 7A and FIG. 7B show an example that demonstrates deforming a mismatching resistor block (FIG. 7A) to a rectangular block (FIG. 7B) after applying the embodiment. FIG. 7C and FIG. 7D show another example that demonstrates deforming a mismatching resistor block (FIG. 7C) to a centrosymmetrical block (FIG. 7D) after applying the embodiment.

Although specific embodiments have been illustrated and described, it will be appreciated by those skilled in the art that various modifications may be made without departing from the scope of the present invention, which is intended to be limited solely by the appended claims.

What is claimed is:

1. A method of resistor matching in analog integrated circuit layout, comprising the following stages:
   analyzing shapes of mismatching resistor blocks to obtain geometrical information for deforming the mismatching resistor blocks;
   deforming the mismatching resistor blocks into centrosymmetrical blocks according to the obtained geometrical information, each said mismatching resistor block being decomposed to a plurality of unit-resistors; and
   placing the unit-resistors into matching resistor blocks to return a resulting layout with improved matching quality by reducing centroid offset between a centroid of the unit-resistors and a centroid of the matching resistor block;
   wherein a step of evaluating degree of centrosymmetry of the mismatching resistor block is performed by rotating the mismatching resistor block 180 degrees and then comparing the rotated mismatching resistor block to the original mismatching resistor block.

2. The method of claim 1, wherein the matching stage comprises:
   generating two mirrored blocks of the mismatching resistor block;
   projecting end points, excluding outermost end points, of edges of the mirrored blocks to the mismatching resistor block, thereby resulting in cut points;
   decomposing the mismatch resistor block by horizontally or vertically cut through the end points and the cut points of edges of the mismatch resistor block, resulting in decomposed rectangles, wherein first-side edges of the rectangles are collected as a first set and second-side edges of the rectangles are collected as a second set;
   taking one edge from the first set from beginning to end and taking one edge from the second set from end to beginning as a centrosymmetry pair; and
   repeating the pairing step until the edges in the first set and the second set are totally paired.

3. The method of claim 2, wherein the deforming stage comprises:
   modifying shapes of the mismatching resistor blocks, under fixed-outline constrains, to the centrosymmetrical blocks; and
   preserving original block topology in an original layout in order not to destroy circuit features.

4. The method of claim 2, wherein the placing stage comprises:
   limiting all normal blocks and all the rectangles of the mismatching resistor block not to exceed width and height of the layout;
   constraining range of width of the normal block and keeping area of the normal block consistent after deformation;
   limiting positions of the normal blocks such that their relative positions are not changed after deformation;
   limiting each neighboring normal block of the mismatching resistor block not overlap therewith;
   connecting the rectangles of the mismatching resistor block; and
   keeping area of the mismatching resistor block consistent after deformation.

5. The method of claim 4, wherein the placing stage comprises:
   first removing one said unit-resistor from the mismatching resistor block, if there are odd number of the unit-resistors;
   placing the removed unit-resistor at the center of the matching resistor block; and
   placing each pair of the unit-resistors centrosymmetrically to the centroid of the matching resistor block.

6. The method of claim 5, further comprising:
   randomly selecting two said unit-resistors from different mismatching resistor blocks and then exchanging positions of the selected unit-resistors; and
   exchanging positions of corresponding unit-resistors of the selected unit-resistors.

* * * * *

UNITED STATES PATENT AND TRADEMARK OFFICE
CERTIFICATE OF CORRECTION

PATENT NO. : 8,751,987 B2  
APPLICATION NO. : 13/547520  
DATED : June 10, 2014  
INVENTOR(S) : Tsung-Yi Ho, Sheng-Jhih Jiang and Chan-Liang Wu Page 1 of 1

It is certified that error appears in the above-identified patent and that said Letters Patent is hereby corrected as shown below:

On the Title Page:

Item (73) Assignee, "Oryx Holdings Pty Ltd., Queensland (AU)" should read --NCKU Research and Development Foundation, Tainan (TW); Himax Technologies, Ltd., Tainan City (TW)--.

Signed and Sealed this  
Eleventh Day of November, 2014

Michelle K. Lee  
*Deputy Director of the United States Patent and Trademark Office*